(12) United States Patent
Oota et al.

(10) Patent No.: US 7,897,306 B2
(45) Date of Patent: Mar. 1, 2011

(54) SUBSTRATE PROVIDED WITH BANK AND SUBSTRATE PROVIDED WITH COLOR PATTERN

(75) Inventors: Yoshikazu Oota, Tokyo (JP); Yasuyuki Demachi, Tokyo (JP)

(73) Assignee: Toppan Printing Co., Ltd. (JP)

( * ) Notice: Subject to any disclaimer, the term of this patent is extended or adjusted under 35 U.S.C. 154(b) by 858 days.

(21) Appl. No.: 11/895,649

(22) Filed: Aug. 24, 2007

(65) Prior Publication Data

US 2009/0053625 A1    Feb. 26, 2009

(51) Int. Cl.
 *G02B 5/20* (2006.01)
(52) U.S. Cl. ............................................................ 430/7
(58) Field of Classification Search ........................ None
See application file for complete search history.

(56) References Cited

U.S. PATENT DOCUMENTS

2007/0184363 A1 * 8/2007 Kim et al. ........................... 430/7

FOREIGN PATENT DOCUMENTS

| JP | 07-035915 | 2/1995 |
|---|---|---|
| JP | 07-035916 | 2/1995 |
| JP | 08-166507 | 6/1996 |
| JP | 09-073010 | 3/1997 |
| JP | 10-197716 A * | 7/1998 |
| JP | 3328297 B2 | 9/2002 |
| JP | 2005-352105 | 12/2005 |
| JP | 2006-084911 | 3/2006 |
| JP | 2006-163233 | 6/2006 |
| JP | 2006-243588 | 9/2006 |
| JP | 2006-251433 | 9/2006 |
| JP | 2006-267821 | 10/2006 |
| JP | 2006-276180 | 10/2006 |
| JP | 2006-284674 | 10/2006 |

OTHER PUBLICATIONS

Computer-generated translation of JP 10-197716 (Jul. 1998).*

* cited by examiner

*Primary Examiner* — John A. McPherson
(74) *Attorney, Agent, or Firm* — Squire, Sanders & Dempsey (US) LLP

(57) ABSTRACT

An embodiment of the present invention will be disclosed below. A bank substrate comprising: a substrate and a bank on the substrate, wherein a surface energy of the bank is 30 to 45 mJ/m². Further, colored pixels are present between zones of the bank, and the difference of height within a pixel of the colored pixels is 0.3 µm or less. The colored pixels comprise colored inks, and a viscosity of the colored inks is 50 mPa·s or less.

8 Claims, 1 Drawing Sheet

SUBSTRATE PROVIDED WITH BANK AND SUBSTRATE PROVIDED WITH COLOR PATTERN

BACKGROUND OF THE INVENTION

1. Field of the Invention

The present invention relates to a substrate provided with a bank and a substrate provided with a color pattern such as a color filter for use in a display device such as a liquid crystal display device.

2. Description of the Related Art

A color filter that is used for color separation in color liquid crystal display devices or image pick-up elements comprises colored pixels of a plurality of colors (for example, red (R), green (G), and blue (B)) and a light shielding bank (black matrix) that partitions the colored pixels. Such color filters have been often produced by a method based on photolithography using a photosensitive resin composition having a pigment dispersed therein as a coloration material. Such a method will be described below with reference to a typical color filter comprising a black matrix and RGB pixels.

First, a black matrix is formed on a substrate. The black matrix can be formed of a light shielding material that does not transmit visible light, and a metal material such as chromium or an inorganic material can be used therefor, but in recent years, resin black matrixes having light shielding particles dispersed in a photosensitive resin have often been used. In this manufacturing method, a light shielding photosensitive resin composition (black resist) is coated on a substrate such as glass, exposure is performed via a mask having the black matrix pattern, development is carried out with a liquid developer such as an alkali, and finally post-baking is performed, for example, at a temperature of 230° C.

A red photosensitive resin composition (color resist) is coated to a predetermined film thickness on the substrate that have thus been provided with the resin black matrix, exposure is performed via a mask of red pixel pattern, and alkali exposure and post-baking are then performed in the same manner as in the formation of the resin black matrix, thereby forming red pixels. Green pixels and blue pixels are then formed in the same manner, and a color filter comprising the resin black matrix and colored pixels of a plurality of colors can thus be obtained. However, such a process for producing a color filter involves a very large number of steps.

Problems encountered in the manufacture of a resin black matrix substrate include the appearance of gas bubbles during color resist coating that are caused by defects of cross-sectional shape of the black matrix, peeling of a black matrix resist film during alkali development, and appearance of residue. Furthermore, problems encountered when a color resist is patterned include misalignment of pixels of a plurality of colors, overhanging of cross-sectional shape of pixels, appearance of pixel defects or color retention caused by inadequate conduction of an ITO film, and appearance of residue.

Yet another problem that is often encountered is mask contamination that is caused by adhesion of color resist sublimates to the mask during exposure. In the photolithographic method, production yield of each step is not sufficiently high. Therefore, the production yield of the entire process is poor, thereby increasing the production cost of color filters.

A high production cost of color filters is due not only to a poor yield, but also to a high cost of glass substrates and black and color (red, green, blue) resist materials. The development of inexpensive color filters is needed for customers such as panel makers and in the industrial field of color filters, and at present, production methods based on printing process and ink-jet process are intensively studied.

With the ink jet process, ink is selectively ejected on a specific region of a target from ultrafine ink nozzles, and specific sections of the object are colored. Ink-jet processes used for manufacturing a color filter can be generally classified into those in which ink receptacles are provided on a color filter substrate that is a target and the ink is fixed, and those in which fine partitions are provided to prevent ink from overflowing. In the latter case, a black matrix provided on the substrate serves as the partitions. A color filter is thus manufactured by ejecting and charging an ink comprising a pigment of a necessary color into a specific region partitioned by the black matrix and then curing the ink to form a colored pixel.

With photolithography, a color resist has to be coated on the entire substrate surface. Therefore, a large amount of resist is wasted. Moreover, coating, exposure, development and post-baking steps have to be repeated as many times as there are colors. By contrast, with the ink-jet method, ink is not wasted, and although a large number of nozzles have to be provided, a plurality of colors can be charged at the same time and the curing process also can be completed in one step.

When a color filter is manufactured by the ink-jet process, color inks of a plurality of colors have to be printed without mixing. Pixels are partitioned by a black matrix, but the problem is that the printed inks overflow the partition walls of the black matrix and are mixed.

Patent Documents 1 and 2 disclose ink-repellent black matrixes. These documents describe inventions in which surface energy of a black matrix is decreased by a fluorine-containing or silicone compound, whereby printed inks of a plurality of colors are prevented from overflowing the black matrix and mixing, wherein ink repellency is imparted by admixing a compound or fine powder particles of the fluorine-containing or silicone compound to a carbon black ink or laminating on the upper surface of black matrix.

When fine powder particles of a fluorine-containing or silicone polymer compound are admixed, because the height of black matrix is typically within a range of 1-3 μm, the particle size has to be at least 0.2 μm or less for uniform ink repellency to be demonstrated, and such fine powder particles of polymer compounds are an extremely expensive material that increases the production cost. Furthermore, such ultrafine polymer particles are easily aggregated and a homogeneous dispersion is difficult to obtain. For these reasons, it can be said that the research using ultrafine polymer particles is difficult from the standpoints of both cost and technology.

Further, with the method of adding a fluorine-containing or silicone compound having a low molecular weight, ink repellency of black matrix is increased, but the addition of a fluorine-containing or silicone compound having a low molecular weight typically causes bleeding or blooming due to poor mutual solubility with the resin, the compound adheres to the printing locations of pixels, repels colored inks, and generates voids in pixels or causes adhesion defects of an overcoat layer.

Further, such compounds are dissolved as impurities in liquid crystals after a liquid crystal panel is assembled and cause display unevenness. Sufficient ink repellency is not demonstrated unless such materials with a low-surface energy are added in an amount of several percents. The increase in amount of the additives raises ink repellency, but causes problems associated with voids in pixels and adhesion, such compounds with a low surface energy have to be cleaned and removed, the number of production steps increases, and cost rises.

[Patent Document 1] Japanese Patent No. 3470352
[Patent Document 2] Japanese Patent No. 3430564

SUMMARY OF THE INVENTION

An embodiment of the present invention will be disclosed below. A bank substrate comprising: a substrate and a bank on the substrate, wherein a surface energy of the bank is 30 to 45 mJ/m$^2$. Further, colored pixels are present between zones of the bank, and the difference of height within a pixel of the colored pixels is 0.3 μm or less. The colored pixels comprise colored inks, and a viscosity of the colored inks is 50 mPa·s or less.

Figure 1:
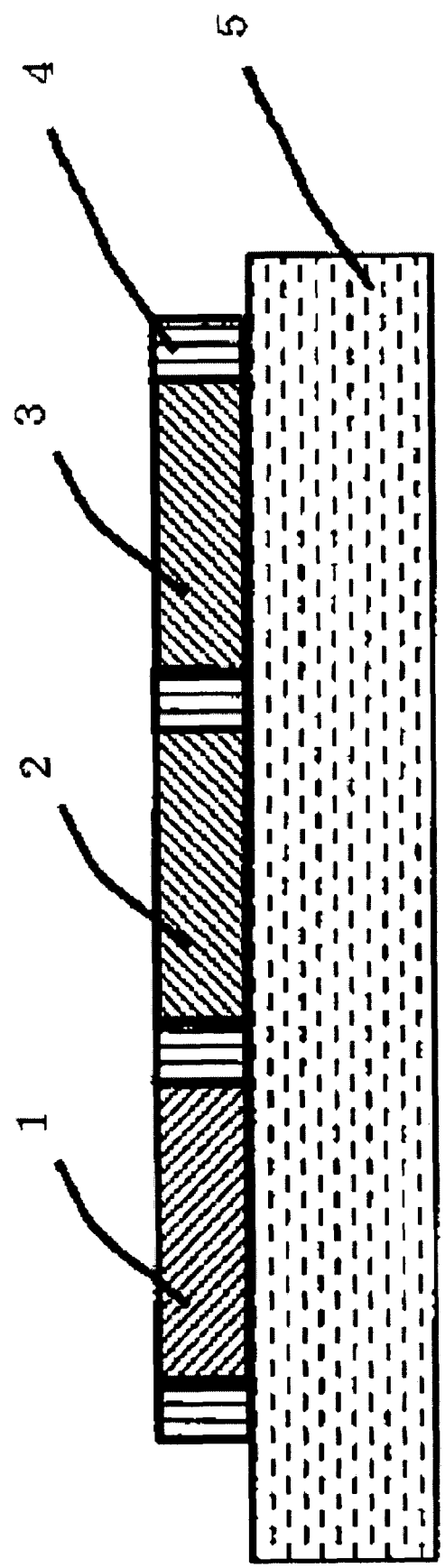
FIG. 1 is an example of a cross-sectional view of a color filter in accordance with the present invention that is manufactured by an ink-jet method.

EXPLANATION OF REFERENCE NUMERALS 1 red pixel printed by ink-jet method
2 green pixel printed by ink-jet method
3 blue pixel printed by ink-jet method
4 bank
5 substrate

DESCRIPTION OF THE PREFERRED EMBODIMENTS

The present invention provides a manufacturing method for forming pixels of a plurality of colors on a substrate having a bank formed therein by using an ink-jet system with good printing accuracy. Pixels of a plurality of colors are formed without color mixing by an ink-jet method, without adding a compound with a low surface energy such as a fluorine-containing compound or a silicone compound to the bank or forming a layer with a low surface energy.

Thus, pixels can be formed without mixing the printed inks, even when no layer with a low surface energy is formed, by adjusting the surface tension of colored inks of a plurality of colors such as RGB that are printed by an ink-jet method to a value that is 10-20 mJ/m$^2$ higher than the value of surface energy of the bank.

The surface tension of colored inks to be printed can be adjusted by changing the solvents used and the content ratio thereof. Where two or more solvents are used, for example, where water with a surface tension of 72.7 mN/m and propylene glycol monomethyl ether acetate with a surface tension of 27.4 mN/m are compounded, while the surface tension of ink based only on water is, for example, 60 mN/m, the surface tension of ink using a mixed solvent comprising water and propylene glycol monomethyl ether acetate at a 1:1 ratio is 43 mN/m.

The surface energy of a bank formed on a glass substrate varies depending on a type of carbon pigment and addition of a dispersant or dispersion enhancer such as a surfactant, but is generally about 40 mJ/m$^2$. Using a mixed solvent comprising water and propylene glycol monomethyl ether acetate makes it possible to adjust the surface tension of colored ink to 60 mN/m to 50 mN/m. Where the difference in surface tension between a bank and ink is 10 mN/m or more, significant ink repellency is demonstrated. As for the printing ability of colored inks by ink-jet process, adjusting ink repellency of inks makes it possible to perform printing so that inks of adjacent pixels are not mixed.

An embodiment of the present invention will be described below in greater detail. First, the present invention provides a method for manufacturing a highly accurate inexpensive substrate provided with a color pattern by an ink-jet method having good printing accuracy on a substrate having a bank formed thereon (substrate provided with a bank).

A substrate that can be used for the substrate provided with a color pattern in accordance with the present invention is preferably a sheet-like or film-like substrate of excellent smoothness and good light transparency. Examples of such substrates include glass, PET (polyethylene terephthalate), and acrylic resin.

Inks of a type that can dried at normal temperature, type that can be dried by heating, and a UV-curable type can be used for ink-jet printing employed in accordance with the present invention. Components commonly used in such inks include a resin (vehicle), a colorant, and a solvent.

Examples of resin compositions include phenolic resins, alkyd resins, aminoalkyd resins, guanamine resins, vinyl chloride resins, butyral resins, styrene-butadiene resins, acrylic resins, epoxy resins, unsaturated polyester resins, polyurethane resins, silicone resins, vinyl acetate emulsions, styrene-butadiene emulsions, acrylic emulsions, aqueous alkyd resins, aqueous melamine resins, aqueous urea resins, aqueous acrylic resins, aqueous phenolic resins, aqueous epoxy resins, and aqueous urethane resins. Resins described above are synthetic resins, but natural water-soluble resins such as casein, gelatin, fish glue, starch, and glue can be also used. The above-described resins can be used individually or in mixtures thereof.

Colorants for the inks can be selected depending on an application of a color pattern. Examples of the applications include a color filter used for a liquid crystal display and the like, and an electroluminescence device.

Colorants for the inks can be selected from dyes and pigments. Dyes have poor light resistance and heat resistance and are sometimes used in combination with pigments. Examples of red dyes that are suitable for RGB color filters are presented below, each being represented by a color index name (C. I. Name)

Color index names (C. I. Names): Direct Red 2, Direct Red 81, Acid Red 1, Acid Red 52, Acid Red 14, Acid Red 27, Acid Red 87, Acid Red 88, Basic Red 1, Mordant Red 3, Azoic Red 21, Vat Red 23, Disperse Red 1, Disperse Red 11, Disperse Red 15, Reactive Red 12. Examples of suitable green dyes include dyes represented by the following color index names (C. I. Names): Direct Green 24, Acid Green 19, Basic Green 4, Azoic Green 1, Vat Green 1, and Disperse Green 1. Examples of suitable blue dyes include dyes represented by the following color index names (C. I. Names): Direct Blue 8, Direct Blue 84, Direct Blue 86, Acid Blue 9, Acid Blue 23, Acid Blue 47, Acid Blue 74, Basic Blue 1, Basic Blue 9, Vat Blue 1, Vat Blue 4, Disperse Blue 1, Disperse Blue 3, Disperse Blue 14, Solvent Blue 11, Reactive Blue 2, Reactive Blue 4, Reactive Blue 7.

Examples of suitable black dyes include dyes represented by the following color index names (C. I. Names): Acid Black 1, Acid Black 2, Acid Black 48, Mordant Black 1, Disperse Black 1, and Reactive Black 5. Yellow dyes, orange dyes, and violet dyes can be also used in addition to these red, green, blue, and black dyes, and combinations of the aforementioned dyes can be also used.

Examples of suitable pigments are presented below. For example, organic pigments are compounds classified as Pigments in the color index (C. I.). Specific examples include pigments represented by the following color index names (C. I. Names)

Pigment Yellow 1, Pigment Yellow 2, Pigment Yellow 3, Pigment Yellow 5, Pigment Yellow 12, Pigment Yellow 13, Pigment Yellow 14, Pigment Yellow 15, Pigment Yellow 17, Pigment Yellow 24, Pigment Yellow 83, Pigment Yellow 108, Pigment Yellow 109, Pigment Yellow 110, Pigment Yellow 123, Pigment Yellow 151, Pigment Orange 1, Pigment Orange 5, Pigment Orange 13, Pigment Orange 16, Pigment Orange 17, Pigment Orange 24, Pigment Orange 40, Pigment Orange 42, Pigment Orange 43, Pigment Red 1, Pigment Red 2, Pigment Red 3, Pigment Red 4, Pigment Red 5, Pigment Red 7, Pigment Red 9, Pigment Red 12, Pigment Red 22, Pigment Red 23, Pigment Red 37, Pigment Red 38, Pigment Red 48, Pigment Red 49, Pigment Red 50:1, Pigment Red 51, Pigment Red 53:1, Pigment Red 57:1, Pigment Red 58:4, Pigment Red 60:1, Pigment Red 63:1, Pigment Red 63:2, Pigment Red 81, Pigment Red 83, Pigment Red 88, Pigment Red 112, Pigment Red 122, Pigment Red 144, Pigment Red 168, Pigment Red 177, Pigment Red 180, Pigment Red 190, Pigment Red 192, Pigment Violet 1, Pigment Violet 3, Pigment Violet 19, Pigment Violet 23, Pigment Violet 31, Pigment Violet 36, Pigment Blue 1, Pigment Blue 2, Pigment Blue 15, 15:3, Pigment Blue 15, Pigment Blue 16, Pigment Blue 17:1, Pigment Blue 18, Pigment Blue 60, Pigment Blue 64, Pigment Green 2, Pigment Green 7, Pigment Green 8, Pigment Green 10, Pigment Green 36, Pigment Black 1, Pigment Black 7, Pigment Black 10, Pigment Black 11, Pigment Black 12.

Examples of inorganic pigments include titanium oxide, barium sulfate, zinc white, lead sulfate, lead yellow, zinc yellow, iron (III) oxide red, cadmium red, ultramarine, Prussian blue, chromium oxide green, cobalt green, amber, and black pigments such as titanium black, synthetic iron black, and carbon black. Examples of suitable commercial products of carbon black include furnace black such as SAF, ISAF, HAF, FEF, and SRF, thermal black such as FT and MT, and acetylene black. These carbon black products can be used individually or in a mixture of two or more thereof.

In a case where an electroluminescence device is formed, light emitting materials can be used as colorants. Examples of light emitting materials (agents) include an organic light emitting body and an inorganic light emitting body.

A substrate provided with a bank can be manufactured by the conventional methods of patterning a photoresist and forming a pattern of printing ink by offset printing. The substrate with a patterned bank is post-baked for 20 min at 230° C. and then RGB pixels are printed thereon.

The film after post-baking of the substrate provided with a bank is formed to a thickness of 1-6 μm. The surface energy of the bank substrate after post-baking is generally 20-45 mN/m, the specific value depending on the compositions of a photoresist used for forming a bank and a printing ink.

For a photoresist or a printing ink, a composition including a dispersant, a resin and a solvent as a main component an be used. The composition can include an ink-repellent agent according to need.

In addition, the usage of a black light shielding agent can allow a bank to have a light shielding property, thereby the bank can be used as a black matrix.

As a black light shielding agent, carbon black or the like can be used.

Because the OD value/μm required for the bank of the present invention used for a black matrix is 3-4, the compounded quantity of carbon black in the photoresist or printing ink used for forming a bank is 30-60 wt. %, as a total solid component, and the composition contains a high ratio of a dispersant, a dispersion enhancer, etc., in the ink. A surfactant that is a dispersant or a dispersion enhancer, and a wax are added at a high content ratio to the ink, and the surface energy of the bank formed by the ink varies depending on the composition of these additives.

In a blended system using a polyethylene wax, a fatty acid ester, and a fluorine-containing surfactant, the surface energy of the bank substrate decreases to 30-35 mN/m, and in a blended system using an epoxy dispersant or the like, the surface energy increases to 35-45 mN/m. Ink repellency is determined by the difference between the surface tension of ink and the surface tension of bank. Significant ink repellency is demonstrated where this difference is 10 mN/m or more. The repellency also varies depending on ink viscosity, and the higher is the viscosity, the lower is the repellency, and the lower is the viscosity the better is the repellency. The best repellency is obtained when ink viscosity is 50 mPa·s or less.

In addition to water, the following water-soluble organic solvents can be used as solvents for inks. Specific examples of suitable solvents include alkyl alcohols comprising 1 to 4 carbon atoms, such as ethanol, methanol, butanol, propanol, and isopropanol, glycol ethers such as ethylene glycol monomethyl ether, ethylene glycol monoethyl ether, ethylene glycol monobutyl ether, ethylene glycol monomethyl ether acetate, diethylene glycol monomethyl ether, diethylene glycol monoethyl ether, diethylene glycol mono-n-propyl ether, ethylene glycol mono-iso-propyl ether, diethylene glycol mono-iso-propyl ether, ethylene glycol mono-n-butyl ether, diethylene glycol mono-n-butyl ether, triethylene glycol mono-n-butyl ether, ethylene glycol mono-t-butyl ether, diethylene glycol mono-t-butyl ether, 1-methyl-1-methoxybutanol, propylene glycol monomethyl ether, propylene glycol monoethyl ether, propylene glycol mono-t-butyl ether, propylene glycol mono-n-propyl ether, propylene glycol mono-iso-propyl ether, dipropylene glycol monomethyl ether, dipropylene glycol monoethyl ether, dipropylene glycol mono-n-propyl ether, dipropylene glycol mono-iso-propyl ether, propylene glycol mono-n-butyl ether, and dipropylene glycol mono-n-butyl ether, formamide, acetamide, dimethylsulfoxide, sorbit, sorbitan, acetin, diacetin, triacetin, and sulfolan.

For example, when a red pigment was dispersed at 30 wt. % in an acrylic emulsion resin with a number-average molecular weight of 150,000-200,000 and the resultant ink was printed by the ink-jet method, the surface tension of ink using water alone as the ink solvent was 65 mN/m, and when a mixed solvent of water and propylene glycol monomethyl ether acetate was used as the solvent composition, the surface tension measured for red inks prepared with the solvent composition ratio (wt.) of 10/90, 20/80, 30/70, 40/60 was 60 mN/m, 55 mN/m, 50 mN/m, and 45 mN/m, respectively.

The red inks with the aforementioned solvent compositions were printed on a bank substrate with a surface energy of 38 mJ/m$^2$ with an ink-jet device having RGB printing heads with 300 nozzles. Where the ink with a surface tension of 45 mN/m in which the solvent composition ratio was 40/60 was printed, the phenomenon of bank overflow and color mixing was not observed, but ink repellence on the bank was delayed and a certain time elapsed before the ink present on the bank was completely repelled.

Where the ink with a surface tension of 50 mN/m in which the solvent composition ratio was 30/70 was printed, the ink present on the bank was rather rapidly repelled. The phenomenon of the ink flowing to other color pixels and causing color mixing was not observed.

The ink with a surface tension of 55 mN/m in which the solvent composition ratio was 20/80 was then printed. This printing was performed with a high speed of repelling and no ink remained on the bank. The ink with a surface tension of 60 mN/m in which the solvent composition ratio was 10/90 and the ink with a surface tension of 65 mN/m that contained only water as the solvent were also ink-jet printed.

Each ink was rapidly repelled and the phenomenon of ink flowing to other color pixels and causing color mixing was not observed. However, when the ink with a surface tension of 60 mN/m and the ink with a surface tension of 65 mN/m were used, the resultant flatness of the printed surface was rather poor. Where no difference between the value of surface tension of the colored ink and the value of surface energy of the bank is 10 mN/m or more, the repellence is slow and the ink remains on the bank unless a sufficient time is allowed to elapse.

The above-described solvents are generally often used as organic solvents for adjusting the surface tension of inks, but N-methyl-2-pyrrolidone (surface tension (25° C.) 41.0 mN/m) and diethylene glycol dimethyl ether (surface tension (25° C.) 29.5 mN/m) can be also used.

Where the difference between the surface tension of ink and the surface energy of bank is within a range of 10 mN/m to 20 mN/m, flat pixels with good repellency and no color mixing are obtained. Where the difference between the surface tension and the surface energy of bank is more than 21 mN/m, color mixing does not occur, but the flatness of printed pixels tends to degrade.

The above-described example refers to water-soluble acrylic emulsion resin, but pixels with high repellency and no color mixing can be also formed with solvent-based resins in which a solvent for surface tension adjustment is a ketone solvent such as ethyl acetate, a cellosolve solvent, or cyclohexanone. In accordance with the present invention, by using a solvent system it is possible to reduce the amount of surfactant used to a minimum, as compared with that of a method in which ink repellency is controlled by adding a surfactant to adjust the surface tension of ink. Therefore, cost can be reduced and because the amount of surfactant in color inks is small, it is possible to provide a highly reliable liquid crystal display device, without concerns for transition of surfactant to a liquid crystal layer.

RGB pixels of a substrate provided with a color pattern may have a stripe arrangement and also a triangular arrangement or mosaic arrangement, but the manufacturing process is the same with any arrangement. With the method for manufacturing a substrate provided with a color pattern in accordance with the present invention, it is not necessary to reduce the surface energy of a bank by admixing the compound with a low surface energy or an ink-repellent layer comprising a fluorine-containing compound or a silicone compound to the bank material.

Basically, an ink-repellent material or a compound with a low surface energy does not have to be used, however these materials can be used according to need.

Where the surface tension of RGB colored inks is by 10-20 mN/m larger than the surface energy of the bank substrate, the printed ink can be repelled by the bank and prevented from mixing with inks for pixels of other colors. The glass surface of pixel portion of the bank substrate can be also subjected to surface treatment such as corona treatment, plasma treatment, and CVD to improve wetting, coating ability, and adhesion of RGB colored inks.

In accordance with the present invention, a pigment can be used together with a dispersant and a dispersion enhancer. More specifically, examples of such dispersants include cationic, anionic, nonionic, amphoteric, silicone surfactants, and fluorine-containing surfactants. Examples of such surfactants include polyoxyethylene alkyl ethers such as polyoxyethylene lauryl ether, polyoxyethylene stearyl ether, and polyoxyethylene oleyl ether, polyoxyethylene alkyl phenyl ethers such as polyoxyethylene octyl phenyl ether and polyoxyethylene nonyl phenyl ether, polyethylene glycol diesters such as polyethylene glycol dilaurate and polyethylene glycol distearate, sorbitan fatty acid esters, fatty acid modified polyesters, and tertiary amine modified polyurethanes.

Examples of typical dispersants for pigments include β-naphthalenesulfonic acid formalin condensate, polycarboxylic acid-type polymer activators, sodium alkylbenzene sulfonates, and lauryl alcohol sulfuric acid ester sodium salts. A combination of these dispersants can be also used. The amount added is preferably 20 parts by weight or less, more preferably within a range of 0.05-10 parts by weight per 100 parts by weight of colored ink solids.

An adhesion enhancer can be also used in the colored ink to improve adhesion to the substrate and adhesion of pigment and resin. Examples of suitable adhesion enhancers include silane coupling agents, titanate coupling agents, and aluminum coupling agents. Examples of suitable silane coupling agents include γ-chloropropyltrimethoxysilane, γ-chloropropylmethyldichlorosilane, γ-chloropropylmethyldimethoxysilane, γ-chloropropylmethyldiethoxysilane, vinyltrichlorosilane, vinyltriacetoxysilane, vinyltriethoxysilane, vinyltrimethoxysilane, vinyl-tris(β-methoxyethoxy)silane, γ-methacryloxypropyltrimethoxysilane, γ-methacryloxypropylmethyldimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, γ-mercaptopropyltrimethoxysilane, amino-functional silane, γ-aminopropyltriethoxysilane, N-phenyl-γ-aminopropyltrimethoxysilane, N-β-(aminoethyl)-γ-aminopropylmethyldimethoxysilane, γ-(polyethyleneamino)propyltrimethoxysilane, N-β-(aminoethyl)-γ-aminopropyltrimethoxysilane, γ-ureidopropyltriethoxysilane, N'-vinylbenzyl-N-trimethoxysilylpropylethylenediamine salt, and methacrylate-chromium chloride composite.

Examples of suitable titanate coupling agents include isopropyltriisostearoyl titanate, isopropyltris(dioctylpyrophosphate) titanate, isopropyltri(N-aminoethyl-aminoethyl)titanate, tetraoctylbis(ditridecylphosphite) titanate, tetra(2,2-diallyloxymethyl-1-butyl) bis(ditridecyl)phosphite titanate, and bis(dioctylpyrophosphate)ethylene titanate.

Acetoalkoxyaluminum diisopropylate is an example of aluminum coupling agents.

These adhesion enhancers can be used individually or in combination of two or more thereof. The amount thereof that is added is preferably 20 parts by weight or less, more preferably within a range of 0.05-10 parts by weight per 100 parts by weight of colored ink solids.

With the method for manufacturing a substrate provided with a color pattern in accordance with the present invention, a surfactant can be added to RGB colored inks to improve wetting of the surface to be coated and leveling ability of the ink and to prevent coating unevenness. A fluorine-containing surfactant or a silicone surfactant can be used. The fluorine-containing surfactant can be anionic, cationic, amphoteric or nonionic surfactant. Examples of anionic surfactants include Surflon S-111 or S-113 (manufactured by Asahi Glass Co., Ltd.), Unidyne DS-101 (manufactured by Daikin Industries, Ltd.), Megafac F120 (manufactured by Dainippon Ink and Chemicals, Inc.) which are perfluoroalkylcarboxylic acid salts.

Other examples include Surflon S-112 (manufactured by Asahi Glass Co., Ltd.) and Megafac F-191 (manufactured by Dainippon Ink and Chemicals, Inc.) which are perfluoroalkylphosphoric acid esters. Examples of perfluoroalkylsulfonic acid salts include Megafac F110 and F113 (manufactured by Dainippon Ink and Chemicals, Inc.).

Examples of cationic surfactants include Surflon S-121 (manufactured by Asahi Glass Co., Ltd.) and Megafac F150 (manufactured by Dainippon Ink and Chemicals, Inc.) which are perfluoroalkyltrimethylammonium salts. Surflon S-131 (manufactured by Asahi Glass Co., Ltd.), which is a perfluoroalkylbetaine, is an example of amphoteric surfactants.

Examples of nonionic surfactants include Surflon S-145 (manufactured by Asahi Glass Co., Ltd.), Megafac F142D, F144D (manufactured by Dainippon Ink and Chemicals, Inc.), and Unidyne DS-401 (manufactured by Daikin Industries, Ltd.), which are perfluoroalkyl ethylene oxide adducts. Examples of other suitable products include oligomers comprising perfluoroalkyl-based lipophylic groups or hydrophilic groups.

Examples of silicone surfactants include KF351, KF352, KF354, and KF615 (manufactured by Shin-Etsu Chemical Industries Co., Ltd.), which are polyether modified silicone oils, and YF3842, TSF 4445, TSF 4452, which are polyoxyalkylene copolymers, and TFA 4200, which is a polydimethylsiloxane-polyethylene oxide copolymer (manufactured by Toshiba Silicone Co., Ltd.). Examples of suitable products manufactured by Toray Silicone Co., Ltd. include SH3746, SH3748, SH3749 which are silicone-polyether copolymers.

The amount of these surfactants used is preferably 5 parts by weight or less, more preferably within a range of 0.01-2 parts by weight based on 100 parts by weight of water-soluble resin or colored ink solids.

With the method for manufacturing a substrate provided with a color pattern by an ink-jet method in accordance with the present invention, a substrate provided with a color pattern can be manufactured, without color mixing of RGB inks, by adjusting the surface tension of pixel inks to 10 $mJ/m^2$ or more higher than the surface energy of the bank and to 20×100 mJ/m or less, without performing the conventional processing such as surface treatment of the bank.

Because the surface tension of inks can be adjusted by changing the composition ratio of solvent comprising two or more solvents, no compound with a low surface energy is required and cost can be reduced by comparison with that of the method involving the formation of an ink-repellent layer.

Further, in accordance with the present invention, because the surface tension of inks is adjusted with a solvent system, the amount of surfactant used can be minimized in comparison with that of a method by which ink repellency is controlled by adding a surfactant. Therefore, cost can be reduced and the amount of surfactant in colored inks is small. As a result, it is possible to provide a highly reliable liquid crystal display device, without concerns for transition of surfactant to a liquid crystal layer.

Furthermore, because a method for adjusting the surface tension of inks in accordance with the present invention can be implemented by using a minimum amount of surfactants, it is possible to provide an inexpensive excellent color pattern substrate that is free from blooming and bleeding of a compound with a low surface energy, such as observed in ink-repellent banks, voids in pixel portions, poor adhesion of overcoat agent, and display defects caused by transition of a compound with a low surface energy to a liquid crystal layer.

Embodiment 1

An example of a color filter is described below.

A bank was formed by printing a black ink of an acrylic resin system on a glass substrate by an offset printing method so as to obtain a film thickness of 2.0 μm after post-baking. The bank pattern was in the form of stripes with a bank line width of 15 μm and the vertical and horizontal size of pixel portions of 220 μm and 80 μm, respectively. The surface energy of the bank was 43 $mJ/m^2$. Ink-jet printing specifications were as follows: nozzle diameter 20 μm and 8-point (location) printing of 1 pixel. A total of 1500 nozzles of RGB colored inks for ink-jet printing were arranged in a printing head. Because a wetting index of the glass substrate at room temperature was 35 mN/m, corona treatment was performed to obtain a wetting index of the glass substrate of 55 mN/m. Pigment Red 177 was selected as a red pigment, Pigment Green 36 was selected as a green pigment, and Pigment Blue 15 was selected as a blue pigment, and red, green, and blue colored inks were prepared by using an acrylic emulsion resin with a number-average molecular weight of 150,000-200,000 as a vehicle. Pigment concentration in each ink was adjusted to a solid fraction ratio of 30 wt. %, and the solid fraction took 60 wt. %. N-methyl-2-pyrrolidone (surface tension (25° C.) 41.0 mN/m) was used as a solvent for adjusting the surface tension of inks, and the weight composition ratio of water and N-methyl-2-pyrrolidone was adjusted to obtain values shown in Tables 1 to 3, so that the viscosity of each ink was adjusted to 50 mPa·s.

Results relating to printability with each colored ink are shown in Tables 1 to 3. An RGB pixel array was formed under conditions with good leveling ability in printing of each RGB ink. A color filter could be formed without voids in pixels caused by a compound with a low surface energy, with a difference of height of each printed RGB filter of 0.3 μm or less, and good flatness.

Embodiment 2

Comparative Example 1

Black inks were prepared by adding SH3746 manufactured by Toray Silicone Co., Ltd. and Megafac F110 manufactured by Dainippon Ink and Chemicals, Inc. at a black ink solid fraction ratio of 0.2 wt. %, 0.5 wt. %, 0.8 wt. % to a black ink used in Embodiment 1. Bank substrates were fabricated by the same procedure as that of Embodiment 1. Then, inks of R color, G color, and B color were prepared with a surface tension of 45 mN/m, 47 mN/m, and 43 mN/m, respectively, by using an acrylic emulsion resin as a vehicle by the same method as that used for preparing RGB inks in Embodiment 1. The RGB water-soluble inks were printed on the bank substrate by the ink-jet method, and printability and leveling ability of the inks were evaluated. The results are shown in Table 4. A problem of color mixing was encountered in none of the tests, but there were some voids in pixels caused by bleeding of a compound with a low surface energy.

Embodiment 3

Comparative Example 2

A silicone resin with a high molecular weight and a fluorine resin with a high molecular weight were ground mechanically to an average particle size of 0.2-0.5 μm, the resins were added to the black ink in an amount of 2 parts by weight, 5 parts by weight, and 8 parts by weight, in the same manner as in Comparative Example 1, and bank substrates were formed.

The R, G, B inks with a surface tension of 45 mN/m, 47 mN/m, and 43 mN/m, respectively, that were prepared in Comparative Example 1 were printed on the bank substrates by the ink-jet method, and leveling ability and printability were evaluated. The results are shown in Table 5. Voids in pixels were observed in none of the tests, but because the particles of polymer resin that were ground and added to the inks had a non-uniform size, the repellence of bank was uneven and a certain color mixing was observed.

The aforementioned tables are presented below. The evaluation items shown in the tables are based on the following criteria.

<Ink Leveling Ability>
◯◯: difference of height in one pixel is 0.3 μm or less.
◯: difference of height in one pixel is more than 0.3 μm and equal to or less than 0.5 μm.
Δ: difference of height in one pixel is more than 0.5 μm and equal to or less than 0.7 μm.
x: difference of height in one pixel is more than 0.7 μm.

<Voids in Pixel Portion>
Present: a colored ink printed on a pixel portion on the substrate is repelled and pixels with visible white substrate are present.
Absent: the predetermined pixel portion is covered with ink and no substrate is visible in any of the pixels.

<Color Mixing>
Present: pixel portions in which an ink of a color different from the predetermined color is admixed are present.
Absent: color mixing is not observed in any of the pixels.

TABLE 1

| Red ink solvent composition ratio Water/N-methyl-2-pyrrolidone | Surface energy of bank mJ/m$^2$ | Surface tension of ink mN/m | Leveling ability of ink | Voids in pixel portion Present/Absent | Color mixing Present/Absent |
|---|---|---|---|---|---|
| 100/0 | 43 | 65 | ◯ | Absent | Absent |
| 90/10 | ↑ | 62 | ◯◯ | Absent | Absent |
| 80/20 | ↑ | 59 | ◯◯ | Absent | Absent |
| 70/30 | ↑ | 55 | ◯◯ | Absent | Absent |
| 60/40 | ↑ | 50 | ◯ | Absent | Absent |
| 50/50 | ↑ | 45 | Δ | Absent | Absent |

TABLE 2

| Green ink solvent composition ratio Water/N-methyl-2-pyrrolidone | Surface energy of bank mJ/m$^2$ | Surface tension of ink mN/m | Leveling ability of ink | Voids in pixel portion Present/Absent | Color mixing Present/Absent |
|---|---|---|---|---|---|
| 100/0 | 43 | 66 | ◯ | Absent | Absent |
| 90/10 | ↑ | 64 | ◯ | Absent | Absent |
| 80/20 | ↑ | 61 | ◯ | Absent | Absent |
| 70/30 | ↑ | 57 | ◯◯ | Absent | Absent |
| 60/40 | ↑ | 52 | ◯ | Absent | Absent |
| 50/50 | ↑ | 47 | Δ | Absent | Absent |

TABLE 3

| Blue ink solvent composition ratio Water/N-methyl-2-pyrrolidone | Surface energy of bank mJ/m$^2$ | Surface tension of ink mN/m | Leveling ability of ink | Voids in pixel portion Present/Absent | Color mixing Present/Absent |
|---|---|---|---|---|---|
| 100/0 | 43 | 62 | ◯◯ | Absent | Absent |
| 90/10 | ↑ | 60 | ◯◯ | Absent | Absent |
| 80/20 | ↑ | 57 | ◯◯ | Absent | Absent |
| 70/30 | ↑ | 53 | ◯◯ | Absent | Absent |
| 60/40 | ↑ | 48 | Δ | Absent | Absent |
| 50/50 | ↑ | 43 | X | Absent | Absent |

TABLE 4

| Name of compound with low surface energy | Amount of compound with low surface energy that was added wt. % | Surface energy of bank mJ/m$^2$ | Surface tension of ink mN/m | Ink color | Leveling ability of ink | Voids in pixel portion Present/Absent | Color mixing Present/Absent |
|---|---|---|---|---|---|---|---|
| SH3746 | 0.2 | 29 | 45 | R | ◯◯ | Present | Absent |
| SH3746 | 0.5 | 28 | 47 | G | ◯◯ | Present | Absent |
| SH3746 | 0.8 | 25 | 43 | B | ◯◯ | Present | Absent |
| F110 | 0.2 | 29 | 45 | R | ◯◯ | Present | Absent |
| F110 | 0.5 | 27 | 47 | G | ◯◯ | Present | Absent |
| F110 | 0.8 | 22 | 43 | B | ◯ | Present | Absent |

TABLE 5

| Name of compound with low surface energy | Amount of compound with low surface energy that was added wt. % | Surface energy of bank mJ/m$^2$ | Surface tension of ink mN/m | Ink color | Leveling ability of ink | Voids in pixel portion Present/Absent | Color mixing Present/Absent |
|---|---|---|---|---|---|---|---|
| Silicone resin | 2 | 25-29 | 45 | R | Δ | Absent | Present |
| Silicone resin | 5 | 25-29 | 47 | G | Δ | Absent | Present |

TABLE 5-continued

| Name of compound with low surface energy | Amount of compound with low surface energy that was added wt. % | Surface energy of bank mJ/m$^2$ | Surface tension of ink mN/m | Ink color | Leveling ability of ink | Voids in pixel portion Present/Absent | Color mixing Present/Absent |
|---|---|---|---|---|---|---|---|
| Silicone resin | 8 | 25-29 | 43 | B | Δ | Absent | Present |
| Fluorine resin | 2 | 22-29 | 45 | R | Δ | Absent | Present |
| Fluorine resin | 5 | 22-29 | 47 | G | Δ | Absent | Present |
| Fluorine resin | 8 | 22-29 | 43 | B | Δ | Absent | Present |

(This application is incorporated by reference which is Japanese application number 2005-88124, which is filed on Mar. 25, 2005.)

What is claimed is:

1. A substrate provided with a color pattern, comprising:
a substrate;
a bank on the substrate; and
colored pixels between zones of the bank, wherein
a surface energy of said bank is 30 to 45 mJ/m$^2$; and wherein
the colored pixels are formed by ejecting and charging colored inks by an ink-jet method; and
the colored inks have a surface tension such that a surface energy thereof is 10-20 mJ/m$^2$ higher than a surface energy of the bank.

2. The substrate provided with a color pattern according to claim 1, wherein
the colored pixels have a plurality of colors.

3. The substrate provided with a color pattern according to claim 1, wherein
a difference of height within a pixel of the colored pixels is 0.3 μm or less.

4. The substrate provided with a color pattern according to claim 1, wherein
a viscosity of the colored inks is 50 mPa·s or less at ambient temperature.

5. The substrate provided with a color pattern according to claim 1, wherein
the colored inks are soluble in water.

6. The substrate provided with a color pattern according to claim 1, wherein
the colored inks comprise water and a solvent for adjusting surface tension, the water: solvent content ratio being from 10-90 : 90-10.

7. The substrate provided with a color pattern according to claim 1, wherein
the bank is formed by patterning a photoresist.

8. The substrate provided with a color pattern according to claim 1, wherein
the bank is formed by an offset printing method.

* * * * *